United States Patent
Mao

(10) Patent No.: US 10,753,973 B2
(45) Date of Patent: Aug. 25, 2020

(54) TEST APPARATUS AND METHOD FOR OPERATING THE SAME

(71) Applicant: Advanced Semiconductor Engineering, Inc., Kaohsiung (TW)

(72) Inventor: Zi-Ning Mao, Kaohsiung (TW)

(73) Assignee: ASE TEST, INC., Kaohsiung (TW)

( * ) Notice: Subject to any disclaimer, the term of this patent is extended or adjusted under 35 U.S.C. 154(b) by 49 days.

(21) Appl. No.: 15/956,703

(22) Filed: Apr. 18, 2018

(65) Prior Publication Data

US 2019/0324082 A1  Oct. 24, 2019

(51) Int. Cl.
  *G01R 31/319* (2006.01)
  *G01R 23/02* (2006.01)
  *G01R 1/04* (2006.01)

(52) U.S. Cl.
  CPC ......... *G01R 31/31903* (2013.01); *G01R 1/04* (2013.01); *G01R 23/02* (2013.01); *G01R 31/31924* (2013.01)

(58) Field of Classification Search
  CPC ........ G01R 31/31903; G01R 31/31924; G01R 1/04; G01R 23/02
  See application file for complete search history.

(56) References Cited

U.S. PATENT DOCUMENTS

| | | | | |
|---|---|---|---|---|
| 6,861,857 B2* | 3/2005 | Moushon | ............. | G01R 1/0466 324/750.25 |
| 7,023,227 B1* | 4/2006 | Wong | ................. | G01R 31/2893 324/750.08 |
| 8,044,673 B1* | 10/2011 | Burgyan | ............. | G01R 1/0483 324/750.16 |
| 2006/0132165 A1* | 6/2006 | Walker | ............. | G01R 31/31924 324/750.3 |
| 2015/0116153 A1* | 4/2015 | Chen | ........................ | H01Q 5/22 342/359 |
| 2016/0109510 A1* | 4/2016 | Vincent | .............. | G01R 31/2875 324/750.25 |
| 2016/0344444 A1* | 11/2016 | Yang | ..................... | H05K 9/0024 |
| 2017/0010306 A1* | 1/2017 | Na | ...................... | G01R 31/2862 |
| 2017/0010324 A1* | 1/2017 | Kim | ....................... | G01R 1/0466 |
| 2017/0356946 A1* | 12/2017 | Gregory | ................. | G01R 31/44 |

* cited by examiner

*Primary Examiner* — Dominic E Hawkins
(74) *Attorney, Agent, or Firm* — Foley & Lardner LLP

(57) ABSTRACT

A test apparatus includes a first insulation housing, a second insulation housing configured to be coupled to the first insulation housing, and a test board including a first portion and a second portion. The first insulation housing and the second insulation housing are configured to cover the first portion of the test board and to expose the second portion of the test board.

18 Claims, 7 Drawing Sheets

TEST APPARATUS AND METHOD FOR OPERATING THE SAME

BACKGROUND

1. Technical Field

The present disclosure generally relates to a test apparatus and a method for operating the same.

2. Description of the Related Art

Test devices are used in the manufacture and maintenance of modern electronic devices and systems, especially for electronic devices and systems operating at a relative high frequency (e.g., a radio frequency, RF). During a testing process, to avoid external interference or noise affecting the test result, a device under test (DUT) can be disposed on a test board which is placed within an insulation box. However, such an insulation box that encloses or covers the whole test board and the DUT is relatively large in size and cost.

In addition, converter(s) (e.g. relays or filters) are integrated with the insulation box for signal transmission (e.g. a direct current (DC) signal or a signal at a relative low frequency) from the test board to external test equipment (e.g., a power supply, an oscilloscope or a digital control circuit). However, design of such converter(s) may vary with the change of the test board and therefore increase the cost. Furthermore, external noise or interference may enter the insulation box through the converter(s) or the space between the insulation box and the converter(s), which can adversely affect test results.

SUMMARY

In one or more embodiments, according to one aspect of the present disclosure, a test apparatus, includes a first insulation housing, a second insulation housing configured to be coupled to the first insulation housing, and a test board including a first portion and a second portion. The first insulation housing and the second insulation housing are configured to cover the first portion of the test board and to expose the second portion of the test board.

In one or more embodiments, according to another aspect of the present disclosure, a test apparatus includes a first insulation cover, a second insulation cover configured to be coupled to the first insulation cover, and a test board, wherein the first insulation cover and the second insulation cover are separated by the test board.

BRIEF DESCRIPTION OF THE DRAWINGS

Common reference numerals are used throughout the drawings and the detailed description to indicate the same or similar elements. The present disclosure will be readily understood from the following detailed description taken in conjunction with the accompanying drawings.

DETAILED DESCRIPTION

Figure 1:
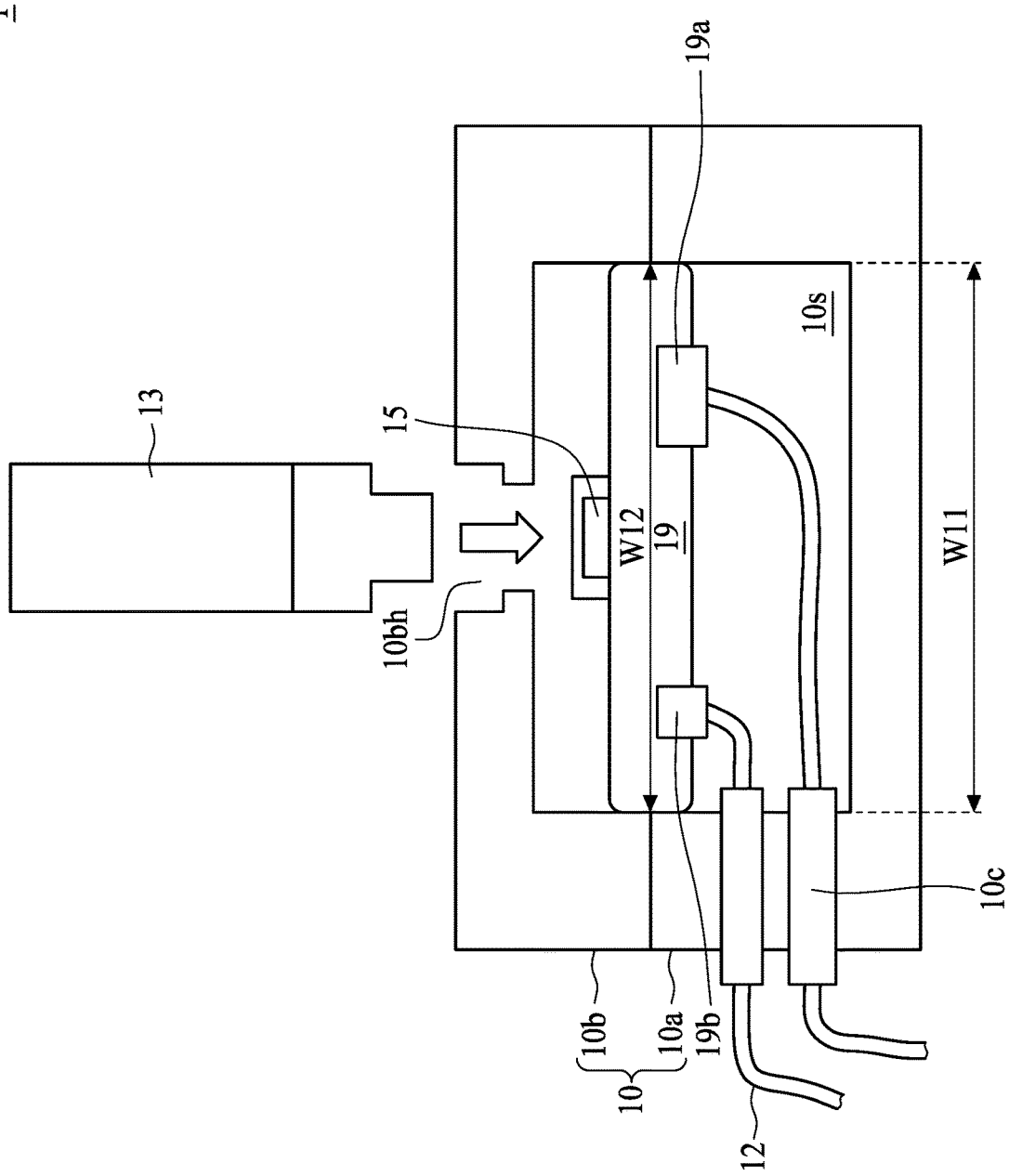
FIG. 1 illustrates a cross-sectional view of a test apparatus in accordance with some embodiments of the present disclosure.

FIG. 1 illustrates a cross-sectional view of a test apparatus 1 in accordance with some embodiments of the present disclosure. The test apparatus 1 includes an insulation box 10, a converter 12, a chuck 13, a device under test (DUT) 15 and a test board 19.

The insulation box 10 includes a first housing 10a (also referred to as a first cover, a lower housing or a lower cover) and a second housing 10b (also referred to as a second cover, an upper housing or an upper cover). The first housing 10a has a bottom surface and lateral surfaces arranged around or surrounding its bottom surface. The second housing 10b has a top surface and lateral surfaces arranged around or surrounding its top surface. The lateral surfaces of the first housing 10a are arranged corresponding to (e.g. continuous with) the lateral surfaces of the second housing 10b to form a space 10s (or a chamber) to accommodate the DUT 15 and the test board 19. The first housing 10a and the second housing 10b are closely connected to prevent external electromagnetic wave radiation from entering the insulation box 10 and affecting a test result. The second housing 10b defines an opening or a hole 10bh on its top surface to accommodate the chuck 13. During the test operation, the chuck 13 is disposed within the opening 10bh and contacts the DUT 15.

The insulation box 10 includes connection members 10c and 12 disposed at one or more lateral surfaces of the first housing 10a. For example, the connection members 10c and 12 may penetrate the lateral surfaces of the first housing 10a to form connection interfaces between the interior of the insulation box 10 and the exterior of the insulation box 10. In some embodiments, the connection member 10c and the connection member 12 can be disposed in a same lateral surface of the first housing 10a. Alternatively, the connection member 10c and the connection member 12 are disposed in different lateral surfaces of the first housing 10a. In some embodiments, the insulation box 10 may include any number of the connection members depending on design specifications.

In some embodiments, the connection member 10c is configured to transmit signals with a relatively high frequency (e.g., RF signals). For example, the connection member 10c is configured to transmit signals with a frequency from about 500 megahertz (MHz) to about 12 gigahertz (GHz), from about 500 MHz to about 3 GHz, from about 500 MHz to about 6 GHz, from about 3 GHz to about 6 GHz, and/or from about 6 GHz to about 12 GHz. For example, the connection member 10c is an RF connector.

In some embodiments, the connection member 12 is configured to transmit signals with a relatively low frequency or a direct current (DC) signals. For example, the connection 12 is configured to transmit a supply power, a digital signal or the like. For example, the connection member 10c is configured to transmit signals with a frequency lower than about 500 MHz. For example, the connection member 12 includes a converter, a relay or a filter. For example, the connection member 12 may be a circuit board with a connector (e.g., an RS-232 connector) to transmit low frequency signals or DC signals.

The DUT 15 is disposed on the test board 19. In some embodiments, the DUT 15 is a chip or a die including circuits, modules or devices operating at high frequencies (e.g., more than about 500 MHz). The DUT 15 can be electrically connected to the test board 19 using, for example, a wire-bonding technique or a flip-chip technique.

The test board 19 is a circuit board, such as a printed circuit board (PCB). The test board 19 may be a single-layer PCB, a double-layer PCB or a multi-layer PCB. In some embodiments, the test board 19 may include an FR-1 circuit board, a CEM-1 circuit board, a CEM-3 circuit board, an FR-4 circuit board, or any other suitable circuit boards.

The test board 19 may include a terminal 19a electrically connected to the connection member 10c and a pin or a node of the DUT 15 that is configured to transmit or receive high frequency signals (e.g., RF signals). For example, the terminal 19a of the test board 19 is electrically connected to the connection member 10c to transmit the high frequency signals from the DUT to a device (e.g., a test device, such as an oscilloscope, vector network analyzers, spectrum analyzers or the like) external to the insulation box 10 and/or to receive the high frequency signals from the device external to the insulation box 10.

The test board 19 may include a terminal 19b electrically connected to the connection member 12 and a pin or a node of the DUT 15 that is configured to transmit or receive DC signals or low frequency signals (e.g., digital signals). For example, the terminal 19b of the test board 19 is electrically connected to the connection member 12 to receive supply power or digital signals from a device (e.g., a power supply, a digital control circuit or the like) external to the insulation box 10 and/or to transmit the low frequency signals from the DUT 15 to the device external to the insulation box 10.

As shown in FIG. 1, since the DUT 15 and the test board 19 are covered or enclosed by the insulation box 10, a width W11 or a length of the space 10s defined by the first housing 10a and the second housing 10b is equal to or greater than a width W12 or a length of the test board 19. For example, one end of the test board 19, or two opposing ends of the test board 19, may contact the housing 10. For example, a cross-sectional area of the space 10s is equal to or greater than a cross-sectional area of the test board 19. To provide for this, a large insulation box 10 may be implemented. However, such an insulation box 10 may increase a cost for testing the DUT 15. In addition, a support (not shown in FIG. 1) for supporting the test board 19 in the insulation box 10 may be customized to match the shape of the test board 19. Therefore, when different kinds of test boards are used, the support and the insulation box may be changed to match the shape and the size of the test board 19, which can also increase the cost for testing the DUT 15.

Furthermore, in order to provide power or digital signals to the DUT 15, the connection member 12 (e.g., the converter, the relay or the filter) may be integrated on the lateral surface of the first housing 10a of the insulation box 10. However, external noise or interference may enter the insulation box 10 through the connection member 12 and/or the space between the connection member 12 and the lateral surface of the first housing 10a, which can adversely affect test results. In addition, design of the connection member 12 may vary with the design of the test board and therefore increase the cost for testing the DUT 15.

Figure 2A:
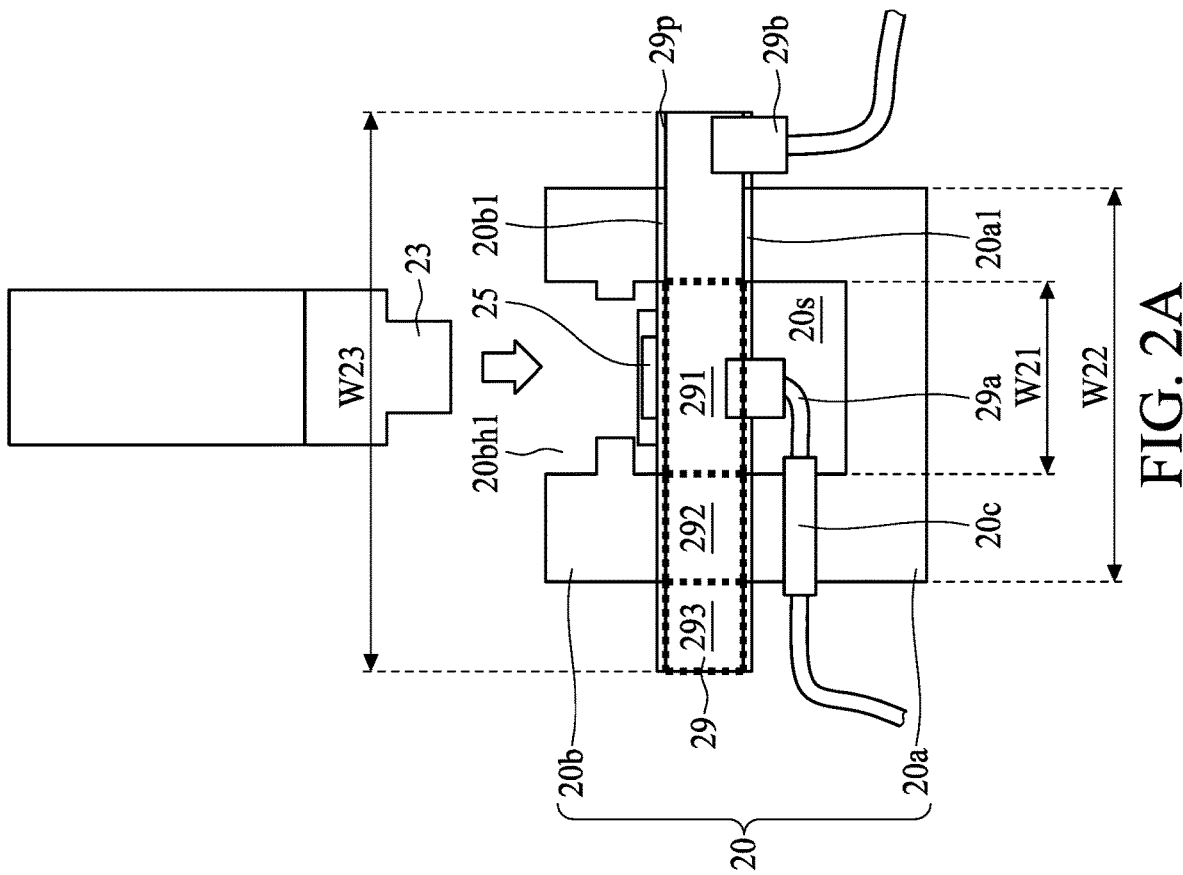
FIG. 2A illustrates a cross-sectional view of a test apparatus in accordance with some embodiments of the present disclosure.

FIG. 2A illustrates a cross-sectional view of a test apparatus 2 in accordance with some embodiments of the present disclosure. The test apparatus 2 includes an insulation box 20, a chuck 23, a device under test (DUT) 25 and a test board 29.

The insulation box 20 includes a first housing 20a (also referred to as a first cover, a lower housing or a lower cover) and a second housing 20b (also referred to as a second cover, an upper housing or an upper cover) configured to be coupled to the first housing 20a. The first housing 20a has a bottom surface and lateral surfaces arranged around or surrounding its bottom surface. The second housing 20b has a top surface and lateral surfaces arranged around or surrounding its top surface. The first housing 20a and the second housing 20b may be insulation housings. The lateral surfaces of the first housing 20a are arranged corresponding to (e.g. continuous with) the lateral surfaces of the second housing 20b to form a space 20s (or a chamber) to cover or accommodate the DUT 25 and one or more portions (e.g., portions 291 and 292) of the test board 29, and to expose another portion (e.g., portion 293) of the test board 29. The second housing 20b defines an opening or a hole 20bh1 on its top surface to accommodate a chuck 23. During a testing operation, the chuck 23 is disposed within the opening 20bh1 and contacts the DUT 25, so that the chuck 23 and the second housing 20b are closely sealed.

Figure 2B:
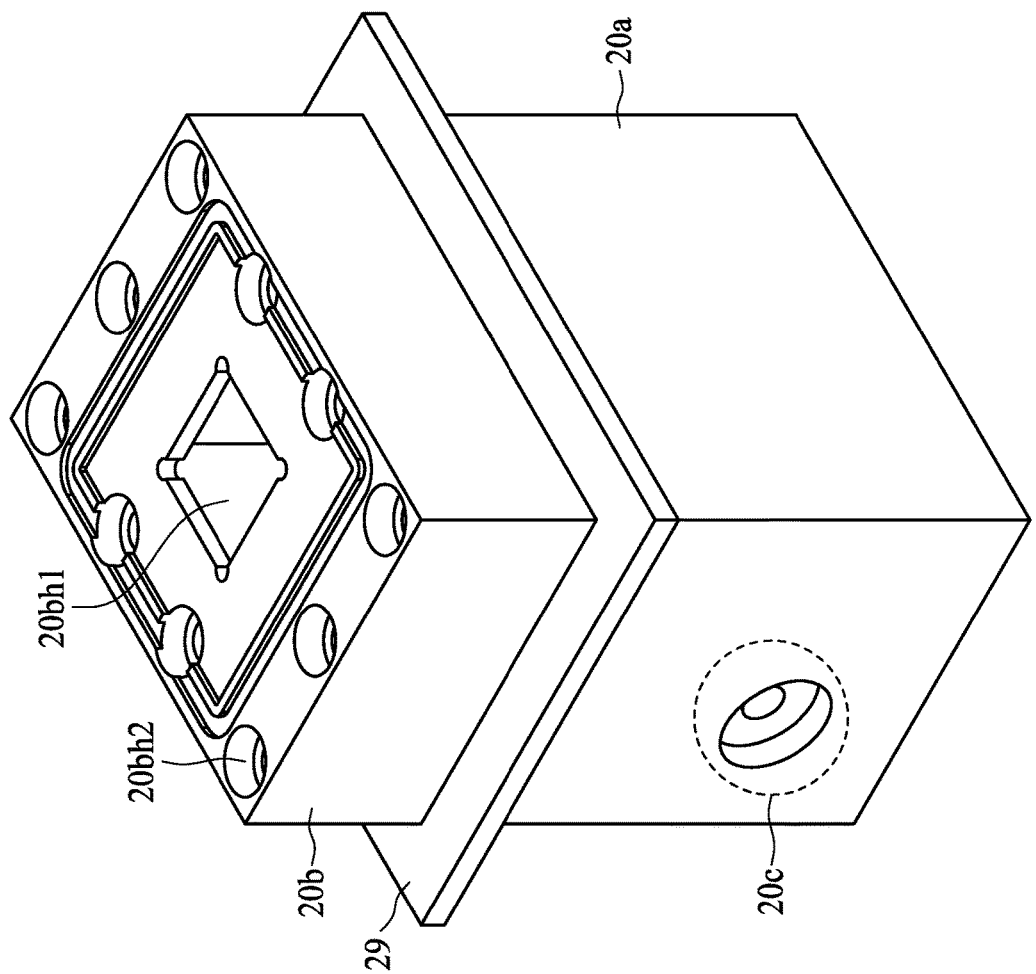
FIG. 2B illustrates a perspective view of a test apparatus in accordance with some embodiments of the present disclosure.

A width W21 or a length of the space 20s defined by the first housing 20a and the second housing 20b is less than a width W23 or a length of the test board 29 (e.g. by a factor of about 0.95 or less, about 0.9 or less, or about 0.85 or less). For example, a cross-sectional area of the space 20s is less than a cross-sectional area of the test board 29 as shown in FIG. 2B (e.g. by a factor of about 0.95 or less, about 0.9 or less, or about 0.85 or less), which illustrates a perspective view of the test apparatus 2 in accordance with some embodiments of the present disclosure. In addition, a width W22 or a length of the first housing 20a is also less than the width W23 or the length of the test board 29 (e.g. by a factor of about 0.95 or less, about 0.9 or less, or about 0.85 or less). For example, a cross-sectional area of the bottom surface of the first housing 20a is less than a cross-sectional area of the test board 29 (e.g. by a factor of about 0.95 or less, about 0.9 or less, or about 0.85 or less) as shown in FIG. 2B.

In some embodiments, the first housing 20a includes a radiation absorbing layer 20a1 on an internal surface of one or more of its sidewalls and/or on a surface that is in contact with the test board 29 (e.g., the portion 292 of the test board 29). In some embodiments, the second housing 20b includes a radiation absorbing layer 20b1 on an internal surface of one or more of its sidewalls and/or on a surface that is in contact with the test board 29 (e.g., the portion 292 of the test board 29). The radiation absorbing layers 20a1 and 20b1 are used to prevent the electromagnetic wave radiation from entering the insulation box 20.

The insulation box 20 includes a connection member 20c disposed at one or more lateral surfaces of the first housing 20a. For example, the connection member 20c may penetrate the lateral surface of the first housing 20a to form a connection interface between the interior of the insulation box 20 and the exterior of the insulation box 20. In some embodiments, the insulation box 20 may include any number of the connection members depending on design specifications. In some embodiments, the connection member 20c is configured to transmit signals with a relatively high frequency (e.g., RF signals). For example, the connection member 20c is configured to transmit signals with a frequency from about 500 MHz to about 12 GHz, from about 500 MHz to about 3 GHz, from about 500 MHz to about 6 GHz, from about 3 GHz to about 6 GHz, and/or from about 6 GHz to about 12 GHz. For example, the connection member 20c is an RF connector.

The DUT 25 is disposed on the test board 29. For example, the DUT 25 is disposed on the portion 291 of the test board 29. In some embodiments, the DUT 25 is a chip or a die including circuits, modules or devices operating at high frequencies (e.g., more than about 500 MHz). The DUT 25 can be electrically connected to the test board 29 using, for example, a wire-bonding technique or a flip-chip technique.

The test board 29 includes a circuit board, such as a printed circuit board (PCB). The test board 29 may be a single-layer PCB, a double-layer PCB or a multi-layer PCB. In some embodiments, the test board 29 may include an FR-1 circuit board, a CEM-1 circuit board, a CEM-3 circuit board, an FR-4 circuit board, or any other suitable circuit boards. The portion 291 is disposed within the space 20s defined by the first housing 20a and the second housing, the portion 293 is exposed from or outside of the insulation box 20, and the portion 292 is disposed between the portions 291 and 293. The portion 292 is in contact with the first housing 20a and the second housing 20b and/or in contact with the radiation absorbing layers 20a1 and 20b1. In some embodiments, the test board 29 includes a protection layer (e.g., a solder mask) 29p covering one or more portions (e.g., the portions 291 and 293) of the test board 29, and exposing the another portion (e.g., the portion 292) of the test board 29.

The test board 29 may include a terminal 29a disposed on the portion 291 of the test board 29. The terminal 29a is electrically connected to the connection member 20c and a pin or a node of the DUT 25 that is configured to transmit or receive high frequency signals (e.g., RF signals). For example, the terminal 29a of the test board 29 is electrically connected to the connection member 20c to transmit the high frequency signals from the DUT 25 to a device (e.g., test device, such as oscilloscope, vector network analyzers, spectrum analyzers or the like) external to the insulation box 20 and/or to receive the high frequency signals from the device external to the insulation box 20.

The test board 29 may also include a terminal 29b disposed on the portion 293 of the test board 29. For example, the terminal 29b is exposed from, or outside of, the insulation box 20. The terminal 29b is electrically connected to a pin or a node of the DUT 25 that is configured to transmit or receive DC signals or low frequency signals (e.g., digital signals). For example, the terminal 29b of the test board 29 is electrically connected to an external device (e.g., a power supply, a digital control circuit or the like) to receive supply power or digital signals and/or to transmit the low frequency signals from the DUT 25 to the external device.

Since external interference or noise has less impact on the low frequency signals or the DC signals, the terminal 29b of the test board 29 may be disposed outside of the insulation box 20 without substantial adverse effect. In other words, the insulation box 20 can be designed to cover the DUT 25 and the terminal 29a of the test board 29 that is configured to transmit and/or receive the high frequency signals, and to expose the terminal 29b of the test board 29 that is configured to transmit and/or receive the DC signals and/or the low frequency signals. Therefore, compared with the insulation box 10 in FIG. 1, the size of the insulation box 20 in FIG. 2A can be significantly reduced, which can reduce the cost for manufacturing the insulation box 20. In addition, the test board 29 is sandwiched by the first housing 20a and the second housing 20b, and thus the support for supporting the test board 29 can be omitted, which can also reduce the cost for testing the DUT 25.

In addition, by exposing the terminal 29b of the test board 29 that is configured to transmit and/or receive the DC signals and/or the low frequency signals from the insulation box 20, the connection member 12 (e.g., converters, relays or filers) as shown in FIG. 1 can be omitted, which can reduce the cost for testing the DUT 25, and can avoid the external noise or interference entering the insulation box 20 through the converters, relays or filers, which can increase an isolation performance of the insulation box 20. In some embodiments, the isolation performance in the insulation box 10 in FIG. 1 is in a range from about 34.5 dB to about 44.8 dB, while the isolation performance in the insulation box 20 in FIG. 2 is in a range from about 74.2 dB to about 75.5 dB. In particular, the isolation performance at the lateral surface of the insulation box 10 in FIG. 1 on which the connection member 12 is disposed is about 34.5 dB, while the isolation performance at the lateral surface of the insulation box 20 in FIG. 2 is about 74.2 dB.

Figure 3A:
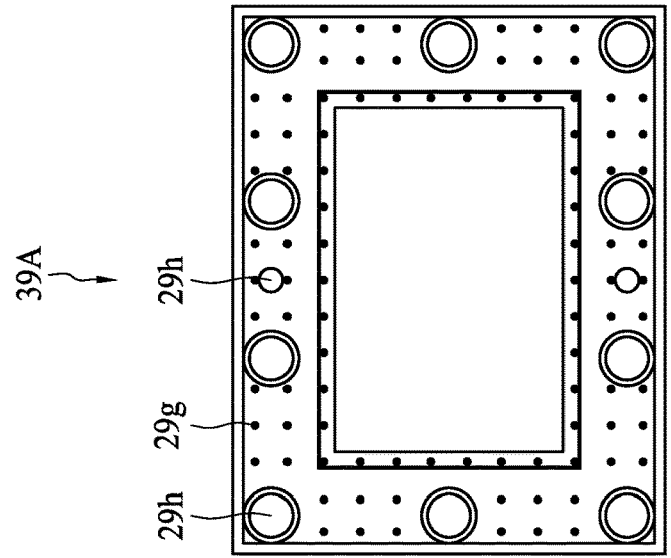
FIG. 3A, FIG. 3B and FIG. 3C illustrate top views of test boards in accordance with some embodiments of the present disclosure.
Figure 3B:
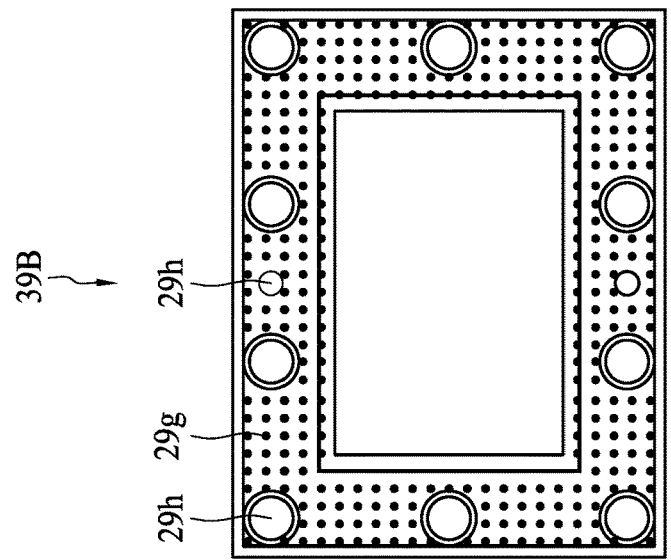
Figure 3C:
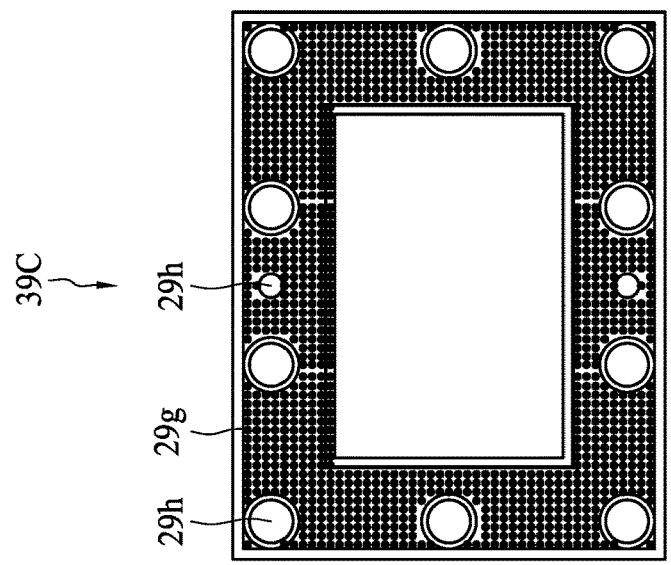

FIG. 3A, FIG. 3B and FIG. 3C illustrate a top view of different types of test boards (39A, 39B and 39C) in accordance with some embodiments of the present disclosure. In some embodiments, the test boards 39A, 39B and 39C can be used in the test apparatus 2 as shown in FIGS. 2A and 2B. As shown in FIGS. 3A, 3B and 3C, each of the test boards 39A, 39B and 39C define a plurality of holes 29h disposed along the periphery of the test boards 39A, 39B and 39C. The holes 29h are disposed corresponding to (e.g. adjacent to) the openings 20bh2 of the second housing 20b as shown in FIG. 2B for the purpose of the positioning and the fastening of the test boards 39A, 39B and 39C during the testing operation. Each of the test boards 39A, 39B and 39C also includes a plurality of grounding elements 29g. In some embodiments, the grounding elements are disposed in the portion 292 of the test board 29 in FIG. 2A, or in corresponding portions of the test boards 39A, 39B and 39C. The grounding elements 29g penetrate the test board 29 and extend from a top surface of the test board 29 to a bottom surface of the test board 29. In some embodiments, the grounding elements 29 are electrically connected to the first housing 20a and the second housing 20b to increase the isolation performance or shielding performance of the insulation box 20. In some embodiments, a respective first portion of each of the grounding elements 29 is exposed from the bottom surface of the test board, a respective second portion of each of the grounding elements 29 is exposed from the top surface of the test board, the first housing 20a is in contact with the respective first portions of the grounding elements 29, and the second housing 20b is in contact with the respective second portions of the grounding elements 29.

In some embodiments, the test boards 39A, 39B and 39C can be designed for different applications. For example, the test board 39A may be applicable to the DUT 25 operating at frequencies less than about 3 GHz, the test board 39B may be applicable to the DUT 25 operating at frequencies less than about 6 GHz, and the test board 39C may be applicable to the DUT 25 operating at frequencies less than about 12 GHz. As shown in FIG. 3A, FIG. 3B and FIG. 3C, a distance (or a pitch) between each two adjacent grounding elements 29g decreases as the operation frequency of the DUT 25 increases.

Figure 4A:
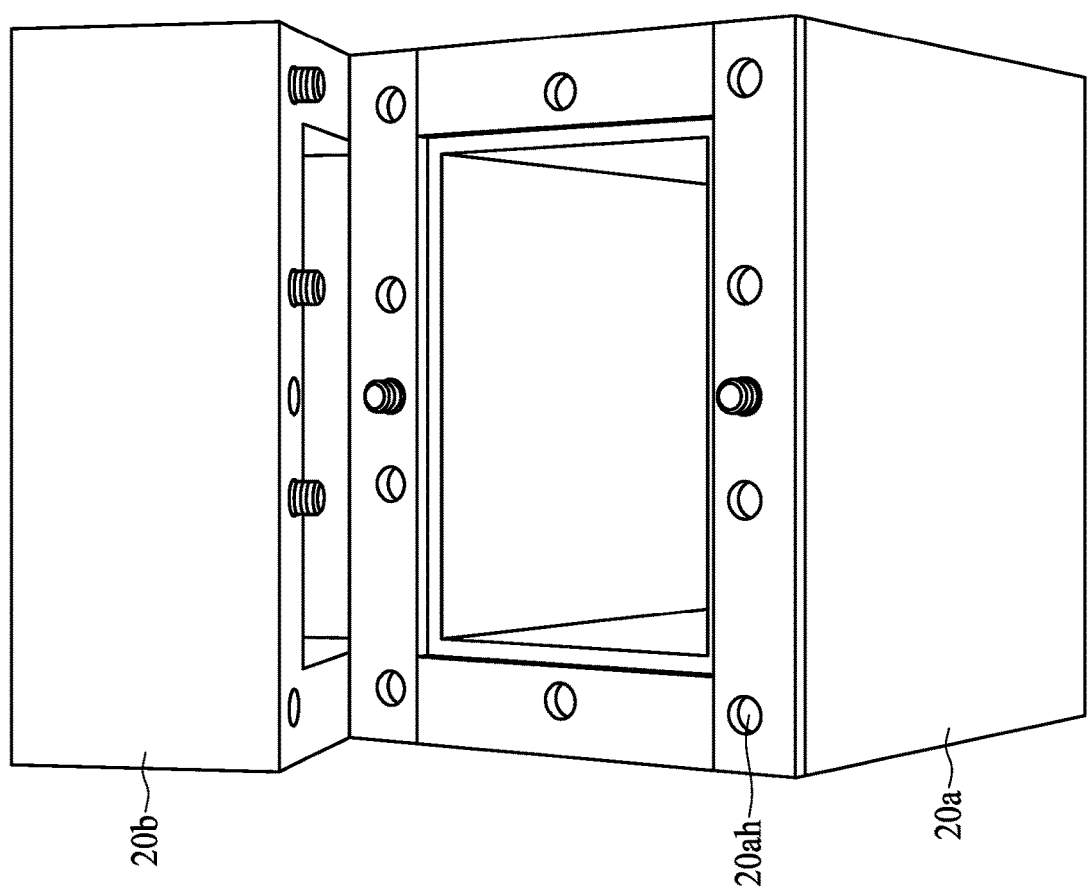
FIG. 4A, FIG. 4B and FIG. 4C illustrate a method for operating a test apparatus in accordance with some embodiments of the present disclosure.
Figure 4B:
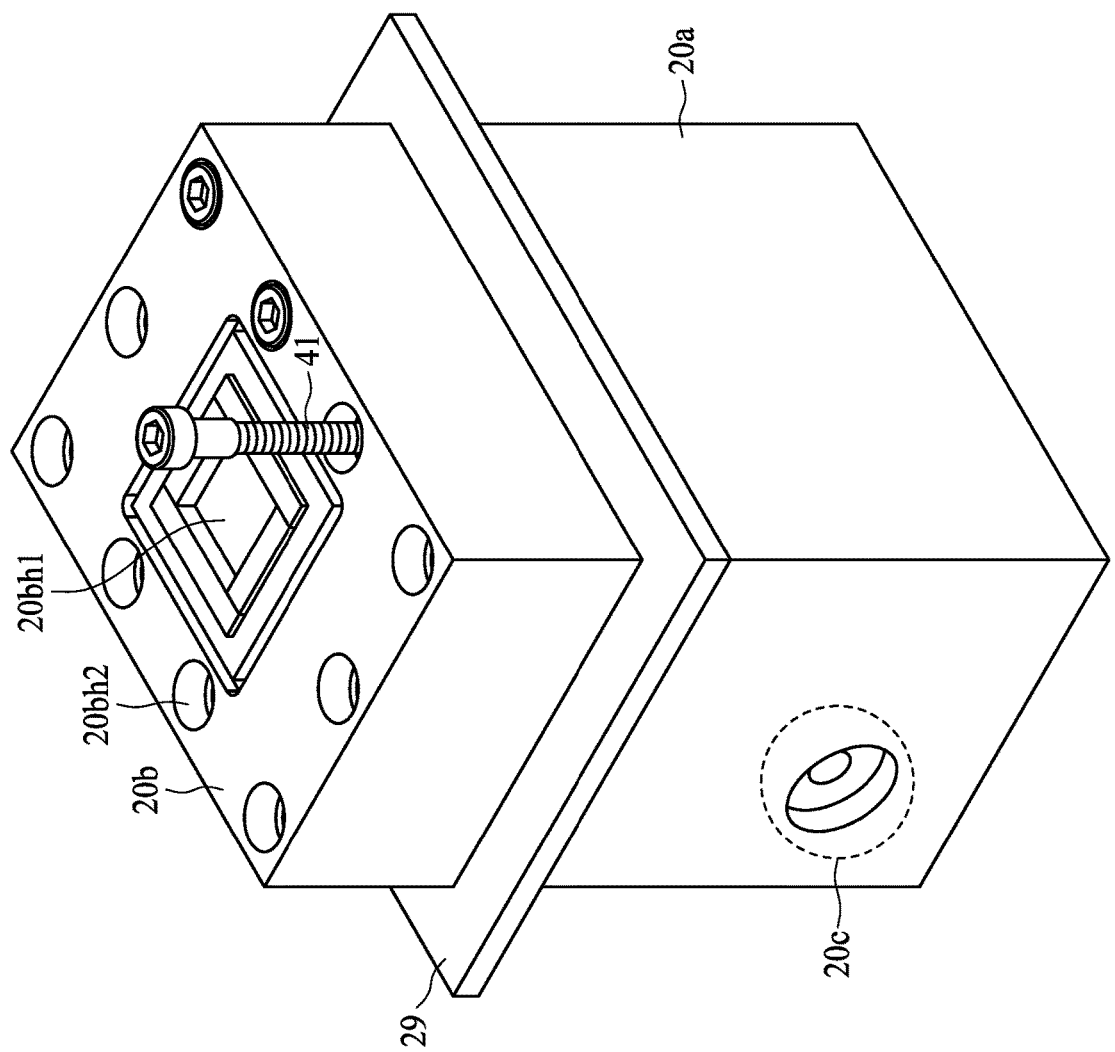
Figure 4C:
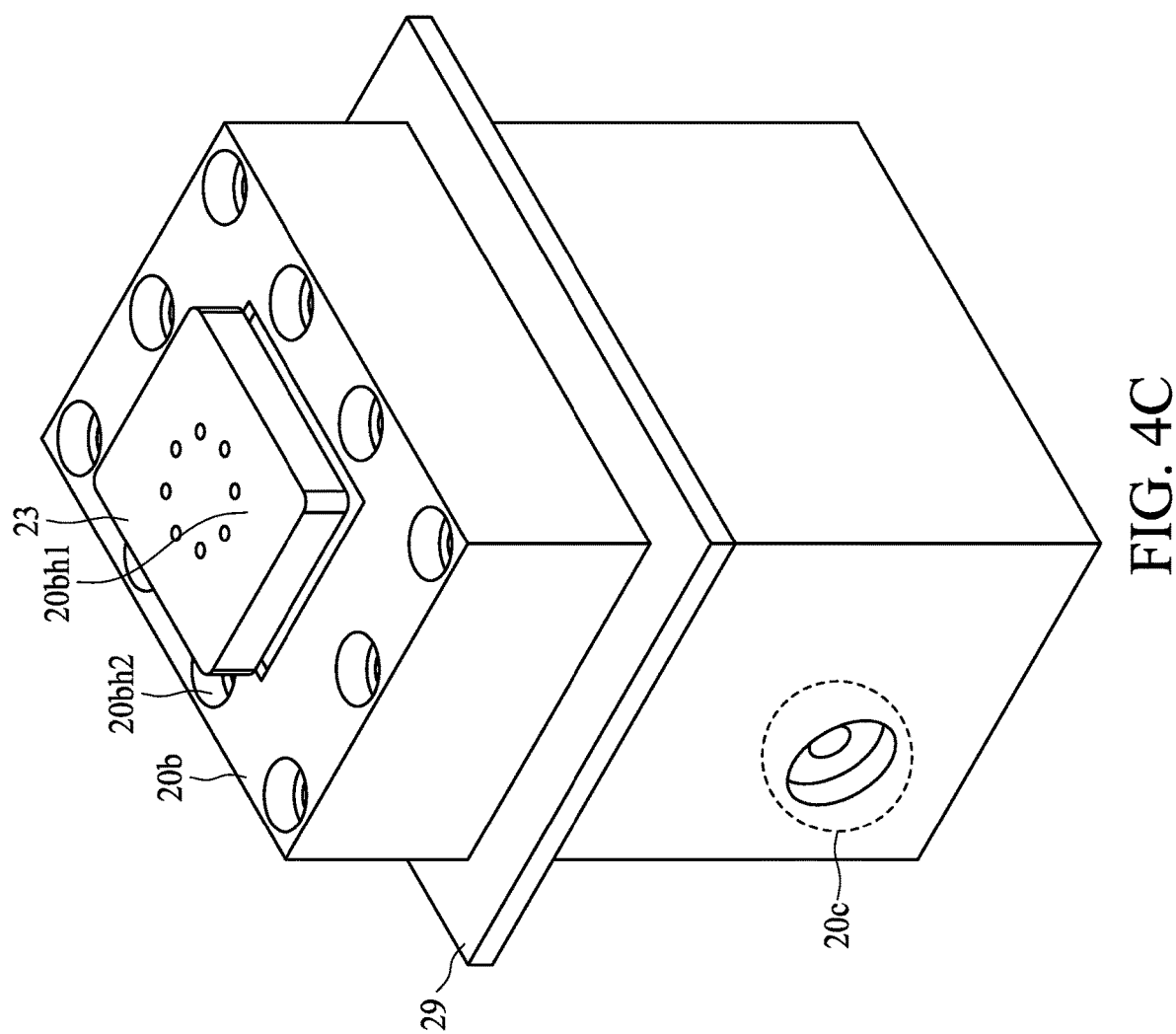

FIG. 4A, FIG. 4B and FIG. 4C illustrate a method for operating the test apparatus 2 as shown in FIG. 2A and FIG. 2B in accordance with some embodiments of the present disclosure.

Referring to FIG. 4A, the first housing 20a is provided. As shown in FIG. 4A, the first housing 20a may define a plurality of holes 20ah corresponding to the holes of the test board to be placed (e.g., the test boards 29, 39A, 39B and 39C) for the purpose of positioning and fastening the test board.

Referring to FIG. 4B, the test board 29 is placed on the first housing 20a and the holes of the test board 29 are aligned with the holes 20ah of the first housing 20a. Then, the terminal (e.g., the terminal 29a in FIG. 2A) of the test board 29 for transmitting the high frequency signals is electrically connected to a connection member 20c on the lateral surface of the first housing 20a.

The second housing 20b is then disposed on the test board 29 to cover the DUT 25 and one or more portions (e.g., the portions 291 and 292) of the test board 29, and to expose another portion of the test board 29 (e.g., the portion 293). The holes of the test board 29 are also aligned with the holes 20bh2 of the second housing 20b. Then, the first housing 20a, the second housing 20b and the test board 29 may be fastened by, for example, screws 41 or any other suitable fasteners. In some embodiments, the test board 29 can be replaced by any of the test boards 39A, 39B, 39C and other suitable test boards.

Referring to FIG. 4C, after the first housing 20a, the second housing 20b and the test board 29 are fastened, the chuck 23 is disposed within the opening 20bh1 of the second housing 20b and in contact with the DUT 25, so that the chuck 23 and the second housing 20b are closely sealed. Then, the connection member 20c is electrically connected to a test device (e.g., an oscilloscope, vector network analyzers, spectrum analyzers or the like) to test the DUT 25.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A test apparatus, comprising:
a first insulation housing;
a second insulation housing configured to be coupled to the first insulation housing; and
wherein the first insulation housing and the second insulation housing are configured to cover a first portion of a test board and to expose a second portion of the test board;
wherein the second portion of the test board laterally extends beyond the first insulation housing and the second insulation housing;
wherein the second portion of the test board includes a first connection member, and the first connection member is configured to transmit or receive a low frequency signal or a direct current (DC) signal.

2. The test apparatus of claim 1, wherein the first portion of the test board includes a second connection member configured to transmit or receive a radio frequency (RF) signal.

3. The test apparatus of claim 2, wherein the first insulation housing includes a third connection member configured to transmit the RF signal to the second connection member or to receive the RF signal from the second connection member.

4. The test apparatus of claim 1, wherein
the test board further comprises a third portion disposed between the first portion and the second portion;

the third portion is in contact with the second insulation housing and the first insulation housing; and the third portion comprises a grounding element.

5. The test apparatus of claim 4, wherein the grounding element is extended from a top surface of the test board to a bottom surface of the test board.

6. The test apparatus of claim 5, wherein the second insulation housing is in contact with a portion of the grounding element exposed from the top surface of the test board and the first insulation housing is in contact with a portion of the grounding element exposed from the bottom surface of the test board.

7. The test apparatus of claim 6, wherein
the first insulation housing includes a first radiation absorbing layer facing the third portion of the test board; and
the second insulation housing includes a second radiation absorbing layer facing the third portion of the test board.

8. The test apparatus of claim 4, wherein the test board further includes a protection layer covering the first portion and the second portion of the test board and exposing the third portion of the test board.

9. The test apparatus of claim 1, wherein the first insulation housing and the second insulation housing define a space, and a cross-sectional area of the space defined by the first insulation housing and the second insulation housing is less than a cross-sectional area of the test board.

10. The test apparatus of claim 1, further comprising a chuck, wherein the second insulation housing defines an opening to accommodate the chuck.

11. The test apparatus of claim 1, wherein the first portion of the test board is configured to support a device to be tested.

12. A test apparatus, comprising:
a test board;
a first insulation cover;
a second insulation cover configured to be coupled to the first insulation cover; and
a first connection member disposed on the test board and exposed from the first insulation cover and the second insulation cover, the first connection member is configured to transmit or receive a signal with a frequency less than 500 MHz;
wherein the first insulation cover and the second insulation cover are separated by the test board.

13. The test apparatus of claim 12, wherein the first insulation cover and the second insulation cover define a space, and wherein the test board comprises:
a first portion disposed within the space defined by the first insulation cover and the second insulation cover; and
a second portion exposed from the first insulation cover and the second insulation cover.

14. The test apparatus of claim 13, wherein the first portion of the test board includes a second connection member configured to transmit or receive a radio frequency (RF) signal.

15. The test apparatus of claim 14, wherein the first insulation cover includes a third connection member arranged to transmit the RF signal to the second connection member or to receive the RF signal from the second connection member.

16. The test apparatus of claim 15, wherein
the test board further includes a third portion disposed between the first portion and the second portion;
the third portion is in contact with the second insulation cover and the first insulation cover; and
the third portion includes a plurality of grounding elements.

17. The test apparatus of claim 16, wherein the grounding elements are disposed to surround the first portion of the test board.

18. The test apparatus of claim 17, wherein
the first insulation cover includes a first radiation absorbing layer facing the third portion of the test board; and
the second insulation cover includes a second radiation absorbing layer facing the third portion of the test board.

* * * * *